United States Patent [19]

Hotta

[11] Patent Number: 5,483,498
[45] Date of Patent: Jan. 9, 1996

[54] SEMICONDUCTOR MEMORY DEVICE INCORPORATING ADDRESS CHANGE DETECTION CIRCUIT FOR PAGE MODE ACCESS

[75] Inventor: Yasuhiro Hotta, Nara, Japan

[73] Assignee: Sharp Kabushiki Kaisha, Osaka, Japan

[21] Appl. No.: 263,819

[22] Filed: Jun. 22, 1994

[30] Foreign Application Priority Data

Jun. 22, 1993 [JP] Japan ................................. 5-150852

[51] Int. Cl.⁶ ..................................... G11C 8/00
[52] U.S. Cl. ..................... 365/233.5; 365/238.5; 365/194; 365/189.07; 326/98
[58] Field of Search ............................ 365/233.5, 238.5, 365/194, 189.07, 233; 326/95, 98; 327/30

[56] References Cited

U.S. PATENT DOCUMENTS

| | | | |
|---|---|---|---|
| 4,744,063 | 5/1988 | Ohtani et al. | 365/233 |
| 4,922,122 | 5/1990 | Dubujet | 307/480 |
| 5,159,574 | 10/1992 | Kim et al. | 365/233.5 |
| 5,264,737 | 11/1993 | Oikawa | 307/265 |
| 5,305,284 | 4/1994 | Iwase | 365/238.5 |
| 5,313,436 | 5/1994 | Matsubishi | 365/233.5 |

OTHER PUBLICATIONS

Ashmore, B., et al., "Session 2: High-speed SRAMs" *ISSCC 89* (IEEE International Solid-State Circuits Conference) (Feb. 15, 1989) pp. 40–41.

*Primary Examiner*—David C. Nelms
*Assistant Examiner*—Andrew Q. Tran
*Attorney, Agent, or Firm*—Morrison & Foerster

[57] ABSTRACT

A semiconductor memory device of the invention is provided with a usual access mode and a rapid access mode. The semiconductor memory device includes: a change detection circuit, provided for each of bit signals which are a part of an address signal, for detecting a change of the address signal; a timer circuit for, when the change detection circuit detects the change of the address signal, generating a signal indicating the change of the address; and an output circuit for outputting the signal generated by the timer circuit as a signal which controls a wait of access in each of the access modes.

22 Claims, 9 Drawing Sheets

SEMICONDUCTOR MEMORY DEVICE INCORPORATING ADDRESS CHANGE DETECTION CIRCUIT FOR PAGE MODE ACCESS

BACKGROUND OF THE INVENTION

1. Field of the Invention

The present invention relates to a semiconductor memory device with a rapid access mode.

2. Description of the Related Art

Recently, as the processing speed of microprocessors and the like is increased, the access speed of a semiconductor memory device is also required to be increased. In order to increase the access speed of the semiconductor memory device, it is also necessary to increase the access speed in random access. In some cases, by special access modes such as a burst mode and a page mode, the access speed is attempted to be increased so as to exceed the access speed in random access.

FIG. 6 shows a construction of a read only memory (ROM) with a general page mode.

In this ROM, a number of bit lines B are formed along a vertical direction of the figure, and a number of row select lines WL are formed along a horizontal direction of the figure so as to cross the bit lines B. To each of the crossings of the bit lines B and the row select lines WL, a memory cell 21 is connected. FIG. 6 only shows one row select line $WL_j$ and (k+1) bit lines $B_{i0}$–$B_{ik}$ which are sequentially made readable in the page mode.

Each memory cell 21 is constructed so as to ground the adjacent bit line B via a MOS transistor $Q_M$. A gate terminal of the MOS transistor $Q_M$ is connected to the adjacent row select line WL. Accordingly, drain terminals of the MOS transistors $Q_M$ of the memory cells 21 arranged in one column are connected to one and the same bit line B. Also, gate terminals of the MOS transistors $Q_M$ of the memory cells 21 arranged in one row are connected to one and the same row select line WL. FIG. 6 only shows (k+1) memory cells 21 connected to the respective crossings of the row select line $WL_j$ and the (k+1) bit lines $B_{i0}$–$B_{ik}$, and MOS transistors $Q_{Mij0}$–$Q_{Mijk}$ corresponding to these memory cells 21.

A transistor $Q_M$ of each memory cell 21 is formed in the following manner: When the memory cell 21 stores the logical state of "0", a threshold value $V_{TH}$ of the transistor $Q_M$ is the same as that in the usual enhancement type. When the memory cell 21 stores the logical state of "1", the threshold value $V_{TH}$ is equal to or larger than the source voltage. Accordingly, any one of the row select lines WL is made to be a high level, among the memory cells 21 connected to the high-level row select line WL, transistors $Q_M$ of memory cells 21 which store the logical state of "0" are turned ON, and transistors $Q_M$ of the other memory cells 21 remain in the OFF state (normal OFF).

The above-mentioned bit lines B are connected to respective input terminals of sense amplifiers 22 via corresponding MOS transistors $Q_C$. Gate terminals of the MOS transistors $Q_C$ are connected to a column select line C. When the column select line C is made to be a high level, the MOS transistors $Q_C$ are turned ON. Each group of (k+1) MOS transistors $Q_C$ is connected to one and the same column select line C. In FIG. 6, (k+1) MOS transistors $Q_{Ci0}$–$Q_{Cik}$ connected to the (k+1) bit lines $B_{i0}$–$B_{ik}$ are commonly connected to one column select line $C_i$.

Each sense amplifier 22 validates a logical level depending on the potential of the corresponding bit line B, and outputs the valid logical level. The bit lines $B_{i0}$–$B_{ik}$ are connected to (k+1) sense amplifiers 22 via the MOS transistors $Q_{Ci0}$–$Q_{Cik}$, respectively. It is understood that a number of bit lines B are also connected to these sense amplifiers 22 via other MOS transistors $Q_C$ which are not shown.

Output terminals of the sense amplifiers 22 are connected to an input terminal of an output buffer 23 via respective MOS transistors $Q_P$. Data select lines P are connected to gate terminals of the MOS transistors $Q_P$. When the data select lines P are made to be a high level, the MOS transistors $Q_P$ are turned ON. As to the data select lines P, (k+1) data select lines $P_0$–$P_k$ constitute one set. The data select lines $P_0$–$P_k$ in one set are respectively connected to gate terminals of (k+1) MOS transistors $Q_P$ which constitute one set. In FIG. 6, the output terminals of the (k+1) sense amplifiers 22 are connected to the input terminal of one output buffer 23 via the (k+1) MOS transistors $Q_{P0}$–$Q_{Pk}$ in one set.

The operation of the ROM having the aboveconstruction will be described with reference to FIG. 7.

When an address signal is made valid at time t11, high-order bits of an address signal are decoded, so that one of row select lines WL and one of column select lines C are made high. Now consider the case where the row select line $WL_j$ and the column select line $C_i$ shown in FIG. 6 are made high. In the memory cells 21 storing the logical state of "0" among the memory cells 21 connected to the row select line $WL_j$, corresponding MOS transistors $Q_M$ are turned ON. Accordingly, the potentials of the bit lines B connected to the memory cells 21 are grounded so as to gradually change to the low level. The MOS transistors $Q_M$ of the other memory cells 21 remain in the OFF state, so that the potentials of the bit lines B connected to these memory cells 21 gradually change to the high level. In addition, since the column selection line $C_i$ is at the high level, the MOS transistors $Q_{Ci0}$–$Q_{Cik}$ are all in the ON state. Accordingly, the potentials of the bit lines $B_{i0}$–$B_{ik}$ connected to the MOS transistors $Q_{Ci0}$–$Q_{Cik}$ are input into the sense amplifiers 22, respectively. The sense amplifiers 22 amplify weak potentials of low or high level of the respective bit lines $B_{i0}$–$B_{ik}$, and output valid logical levels $S_{i0}$–$S_{ik}$. However, the sense amplifiers 22 require a certain time for amplifying the weak potentials so as to validate the logical levels $S_{i0}$–$S_{ik}$.

At time t11, low-order bits of the address signal are also decoded, so that one of the (k+1) data select lines $P_0$–$P_k$ is set to be a high level. Now consider the case where the data select line $P_0$ is made high as shown in FIG. 7. The MOS transistor $Q_{P0}$ connected to the data select line $P_0$ is turned ON, so that only the logical level $S_{i0}$ of the sense amplifier 22 which is obtained by amplifying the potential of the bit line $B_{i0}$ is output via the output buffer 23 at time t12. As described above, the usual access mode which is the normal access mode requires a time period TN from the validation of the address signal at time t11 to the output of the data of logical level $S_{i0}$ from the output buffer 23 at time t12. The time period TN is relatively long because the time period TN includes the time required for the validation of logical level by the sense amplifier 22.

However, at time t12, the remaining k sense amplifiers 22 also finish validating the logical levels $S_{i1}$–$S_{ik}$ of the bit lines $B_{i1}$–$B_{ik}$. Due to this fact, when only the low-order bits of the address signal are changed so as to sequentially set the data select lines $P_1$–$P_k$ to be a high level, the output buffer 23 outputs the data of logical level $S_{i1}$ at time t13 after the data select line $P_1$ is set to be a high level, and outputs data of logical level $S_{i2}$ at time t14, and so on. In this way, it is possible to sequentially output the data of logical levels at a time interval of $T_P$ until the data of logical level $S_{ik}$ is output. The time interval $T_P$ is extremely short because it is not necessary for the sense amplifiers 22 to validate the logical levels. As a result, a rapid access can be realized.

As described above, the ROM shown in FIG. 6 operates in the usual or normal access mode in the first access. However, if the access is continuously performed to the succeeding addresses, it is possible to perform the rapid access in the page mode for the succeeding k addresses at the most. It is understood that such an increase of the access speed can also be realized in other semiconductor memory devices such as an erasable and programmable ROM (EPROM) and a dynamic random access memory (DRAM), in addition to the ROM.

However, when the rapid access in the page mode is performed in the ROM or the like, it is necessary for the microprocessor and the like to check as to whether the sequentially specified address is included in the same page range of (k+1) addresses, and if necessary to change the access mode depending on the checked result. Such check and mode change complicate the access process for the semiconductor memory device. As a countermeasure against the complicated access process, one method is conventionally proposed. In the proposed method, if it is necessary to switch the rapid access mode to the usual access mode, the semiconductor memory device informs the microprocessor and the like of the switching necessity, and the microprocessor and the like automatically waits during the change of the access mode. Specifically, at the 1989 IEEE International Solid-State Circuits Conference (ISSCC), there was an announcement as to an EPROM in which a miss (non-local) signal $\overline{MISS}$ is output when the access mode is to be changed from the burst mode to the usual access mode.

FIG. 8 shows the construction of a conventional EPROM. The EPROM includes a memory array 1 with memory cells having an organization of 64K×16 bits. The twelve high-order bits of the address signal $A_4$–$A_{15}$ among sixteen bits of the address signal $A_0$–$A_{15}$ are input into an X decoder 3 via a first address input circuit 2 and a first latch circuit 10. As a result, the memory cells in the memory array 1 are accessed. Specifically, the high-order bits of the address signal $A_4$–$A_{15}$ are input to the first latch circuit 10 via the first address input circuit 2. A chip select signal $\overline{CS}$ is in a low-level (active) state. In the above condition, at the timing of the falling edge (when becoming active) of an address strobe signal $\overline{AS}$, the high-order bits of the address signal $A_4$–$A_{15}$ are latched by the latch circuit 10. Then, the high-order bits of the address signal $A_4$–$A_{15}$ are fed from the latch circuit 10 to the X decoder 3, so that 256 memory cells in the memory array 1 are selected and the 256 bits of data thereof are simultaneously read out. A logical circuit 15 is used for gating the address strobe signal $\overline{AS}$ in accordance with the chip select signal $\overline{CS}$.

As to the 256 bits of data read out from the memory array 1, respective logical levels are validated respectively by 256 sense amplifiers in a sense amplifier circuit 5. The data of valid logical levels are output to a multiplexer 6 via line buffers in the sense amplifier circuit 5. The four low-order bits of the address signal $A_0$–$A_3$ are input to the multiplexer 6 via a second address input circuit 8. Then, depending on the value of the address signal of the low-order bits $A_0$–$A_3$ (one of 16 values), the data of 16 bits are selected from the 256 bits (16×16 bits) of data. The selected 16 bits of data are output to an output circuit 7. When both of the chip select signal $\overline{CS}$ and an output enable signal $\overline{OE}$ are at the low level (active), the output circuit 7 outputs the 16 bits of data which are fed from the multiplexer 6 to data buses and the like as data $D_0$–$D_{15}$ of 1 word. A logical circuit 13 is used for gating the output enable signal $\overline{OE}$ in accordance with the chip select signal $\overline{CS}$, and converts the signal into a signal in a positive logic which is in turn output.

Accordingly, in the EPROM, the logical levels of the 256 bits of data are made valid by the sense amplifier circuit 5 in the first access. Thereafter, by changing only four low-order bits of the address signal $A_0$ to $A_3$, it is possible to perform the rapid access to the succeeding sixteen 16-bit data.

The twelve high-order bits of the address signal $A_4$–$A_{15}$ which are latched in the first latch circuit 10 are also fed to a second latch circuit 11. In the low level (active) condition of the chip select signal $\overline{CS}$, the second latch circuit 11 latches the high-order bits of the address signal $A_4$–$A_{15}$ at the timing of the rising edge (when returning to be inactive) of the address strobe signal $\overline{AS}$. The high-order bits of the address signal $A_4$–$A_{15}$ latched in the second latch circuit 11 are fed to a comparator circuit 12 together with the high-order bits of the address signal $A_4$–$A_{15}$ which are input via the first address input circuit 2 at that time. The comparator circuit 12 outputs a low level when the sets of high-order bits of the address signals $A_4$–$A_{15}$ do not match with each other. The comparator circuit 12 outputs a miss signal $\overline{MISS}$ which becomes a low level (active) when the low level is output from the comparator circuit 12, to the outside via a logical circuit 14. The logical circuit 14 is used for gating the output of the comparator circuit 12 in accordance with the chip select signal $\overline{CS}$. Both the output of the logical circuit 15 and the output of the comparator circuit 12 are fed to the sense amplifier circuit 5 via a logical circuit. Accordingly, the sense amplifier circuit 5 is made to operate only when both the chip select signal $\overline{CS}$ and the address strobe signal $\overline{AS}$ are at the low level (active) and the output of the comparator circuit 12 is at the low level, i.e., when the access is performed to the memory array 1 and the high-order bits of the address signals $A_4$–$A_{15}$ do not match with each other.

The access operation of the EPROM having the above construction will be described with reference to FIGS. 9 and 10.

It is assumed that at time t20 in FIG. 9, both the chip select signal $\overline{CS}$ and the output enable signal $\overline{OE}$ are at a low level (active), and the high-order bits of the address signal $A_4$–$A_{15}$ having a value of #N is input into the first address input circuit 2 and latched in the first latch circuit 10. When the address strobe signal $\overline{AS}$ is again made high (inactive) at time t21, the high-order bits of the address signal $A_4$–$A_{15}$ of #N are latched in the second latch circuit 11.

Herein, as is shown in the figure, it is assumed that the high-order bits of the address signal $A_4$–$A_{15}$ are changed to be a value of #M at time t22. The comparator circuit 12 detects the mismatch with the high-order bits of the address signal $A_4$–$A_{15}$ (#N) latched in the second latch circuit 11, so as to output a low level. Thus, the miss signal $\overline{MISS}$ becomes low level (active). At time t23, the address strobe signal $\overline{AS}$ becomes low level (active), and the first latch circuit 10 latches the high-order bits of the address signal $A_4$–$A_{15}$ which are then fed to the X decoder 3. At this time, the output of the logical circuit 16 is at the high level, so that the sense amplifier circuit 5 is driven. As a result, new 256 bits of data are read out from the memory array 1, and the logical levels thereof are made valid by the sense amplifier circuit 5. At time t24, the output circuit 7 outputs the 16-bit data $D_0$–$D_{15}$ which are selected by the multiplexer 6 based on the low-order bits of the address signal $A_0$–$A_3$ which are changed simultaneously with the high-order bits of the address signal $A_4$–$A_{15}$. When the address strobe signal $\overline{AS}$ risers to a high level at time t25, the second latch circuit 11 latches the high-order bits of the address signal $A_4$–$A_{15}$ having the value of #M. Therefore, the output of the comparator circuit 12 becomes high level, so that the miss signal $\overline{MISS}$ is also returned to the high level (inactive).

Therefore, in the case of FIG. 9, the access is performed in a usual access mode in which the sense amplifier circuit 5 makes the logical levels valid. The microprocessor and the like wait during The low level (active) period of the miss signal $\overline{MISS}$. Thus, it is possible to surely read out the data $D_0$–$D_{15}$ without considering the access mode.

Thereafter, if only the low-order bits of the address signal $A_0$–$A_3$ are changed at time t26 as is shown in FIG. 10, the value of the high-order bits of the address signal $A_4$–$A_{15}$ is not changed from #M. Thus, the output of the comparator circuit 12 remains at the high level, and the miss signal $\overline{MISS}$ also remains at the high level. However, the multiplexer 6 selects other data from the line buffers in the sense amplifier circuit 5 in accordance with the changed low-order bits of the address signal $A_0$–$A_3$. Accordingly, at time t27 after the lapse of an extremely short time period, the output circuit 7 can output a new set of 16-bit data $D_0$–$D_{15}$ which are selected by the multiplexer 6. Thereafter, if only the low-order bits of the address signal $A_0$–$A_3$ are sequentially switched as is shown in the figure, the corresponding 16-bit data $D_0$–$D_{15}$ can be read out at a high speed. Therefore, in the case of FIG. 10, the access is performed in a rapid access mode in which the sense amplifier 5 is not required to validate the logical levels, and the miss signal $\overline{MISS}$ maintains the high level (inactive). Thus, a microprocessor and the like can sequentially read out the output data $D_0$–$D_{15}$ at a high speed without an excess waiting period.

As described above, in the EPROM shown in FIG. 8, the access mode can be automatically changed by monitoring the miss signal $\overline{MISS}$. Accordingly, the EPROM shown in FIG. 8 has an advantage in that the load for the microprocessor and the like can be reduced during the rapid access mode. In another type of semiconductor memory device, the miss signal $\overline{MISS}$ can be output in the same way.

However, in the conventional device, in order to produce such a miss signal $\overline{MISS}$, two latch circuits 10 and 11 for temporarily storing the multiple bits of the address signal $A_4$–$A_{15}$ are required in addition to the comparator circuit 12. If the number of bits of the address signal are increased as the storing capacity of the semiconductor memory device is increased, it is necessary to increase the number of bits in the latch circuits 10 and 11. This results in a further increase of circuit scale.

The above-described conventional latch circuits 10 and 11 use the address strobe signal $\overline{AS}$ which asserts the validation of the address signal, in order to latch the high-order bits of the address signal $A_4$–$A_{15}$. However, in the presently used semiconductor memory device, a non-synchronous or asynchronous system in which such an address strobe signal $\overline{AS}$ is not used is mainly used due to the convenience.

Accordingly, the conventional semiconductor memory device involves a problem in that, when a miss signal $\overline{MISS}$ is produced for conveniently using the rapid access mode, the chip area is increased because of the increase of circuit scale of the latch circuits 10 and 11. In addition, the conventional semiconductor memory device operates in a non-synchronous or asynchronous system in which the operation is performed by the input of the address signal without using the address strobe signal $\overline{AS}$. Whereas, in order to produce the miss signal $\overline{MISS}$, it is necessary to use the address strobe signal $\overline{AS}$ in a synchronous system. This significantly limits the range of use.

SUMMARY OF THE INVENTION

The semiconductor memory device of this invention is capable of operating in a usual access mode and a rapid access mode. The semiconductor memory device includes: change detection means, provided for each of bit signals which are a part of an address signal, for detecting a change of the address signal; timer means for, when the change detection means detects the change of the address signal, generating a signal indicating the change of the address for a prescribed time period; and output means for outputting the signal generated by the timer means as a signal which controls a wait of access in each of the access modes.

In one embodiment of the invention, the change detection means includes a delay circuit to which the bit signal is input, and means for comparing the bit signal with the bit signal which is delayed by a predetermined time in the delay circuit.

In another embodiment of the invention, the rapid access mode is a page mode.

The change detection means compares, for each of some bit signals of an address signal, a present value with a previous value which was input earlier than the present value by a predetermined time. The bit signals which are compared in the change detection means are part of the address signal, but all of the bit signals whose change always requires a mode change back to the usual access mode.

When any of the bit signals of the part are changed, i.e., when the address signal is changed, a timer circuit outputs a signal indicating the change of the address signal. This output is maintained for the predetermined time. The output of the timer circuit is maintained by the output means for the predetermined time.

As described above, when bit signals of an address signal which require the mode change back to the usual access mode are changed, the semiconductor memory device of this invention outputs a signal indicating the change of the address signal until the output data is made valid in the usual access mode. When the other bit signals are changed, the signal indicating the change of the address signal is not output. Accordingly, a microprocessor and the like are in the waiting state for a time period in which the signal indicating the change of the address signal is output. If the signal indicating the change of the address signal is not output, the access is performed without any excess wait. Thus, the rapid access mode can be automatically utilized without considering the access mode.

If the change detection means has a construction in which present bit signals are compared with previous bit signals which are delayed by a delay circuit, the change detection means detects the change of these bit signals. Accordingly, unlike the prior art example, it is unnecessary to store a multiple of bit signals in a latch circuit. This can simplify the circuit configuration. In addition, once the change of the bit signals is detected, the timer circuit continuously outputs a signal indicating the change of the address signal for a predetermined time period. Thus, it is possible to output a miss signal which is the same as that in the prior art example, without using an address strobe signal and in a non-synchronous manner. The predetermined time period in which the timer circuit outputs the signal indicating the change of the address signal can be a time period which is independently set by a one-shot circuit (monostable multivibrator) or the like. Alternatively, the predetermined time period may be a time period depending on a prescribed delay time by the delay circuit, i.e., for example, a time period obtained by adding the prescribed delay time to another delay time.

Thus, the invention described herein makes possible the advantage of providing a semiconductor memory device which can produce a miss signal in a non-synchronous manner with a simple circuit configuration.

This and other advantages of the present invention will become apparent to those skilled in the art upon reading and understanding the following detailed description with reference to the accompanying figures.

DESCRIPTION OF THE PREFERRED EMBODIMENTS

Hereinafter, one embodiment of the present invention will be described in detail with reference to the accompanying drawings.

Figure 1:
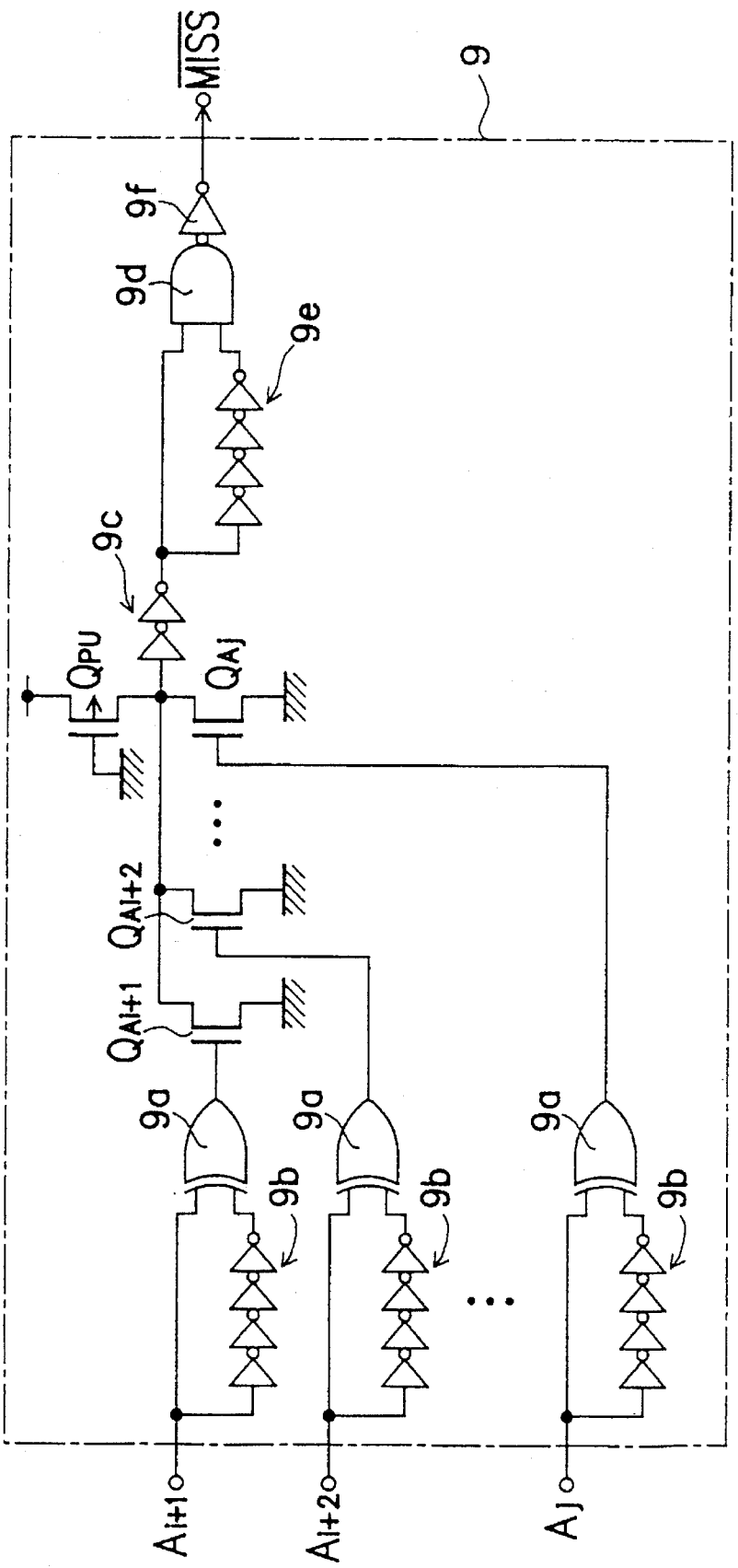
FIG. 1 is a block diagram showing a construction of an address change detection circuit in one embodiment of the invention.
Figure 2:
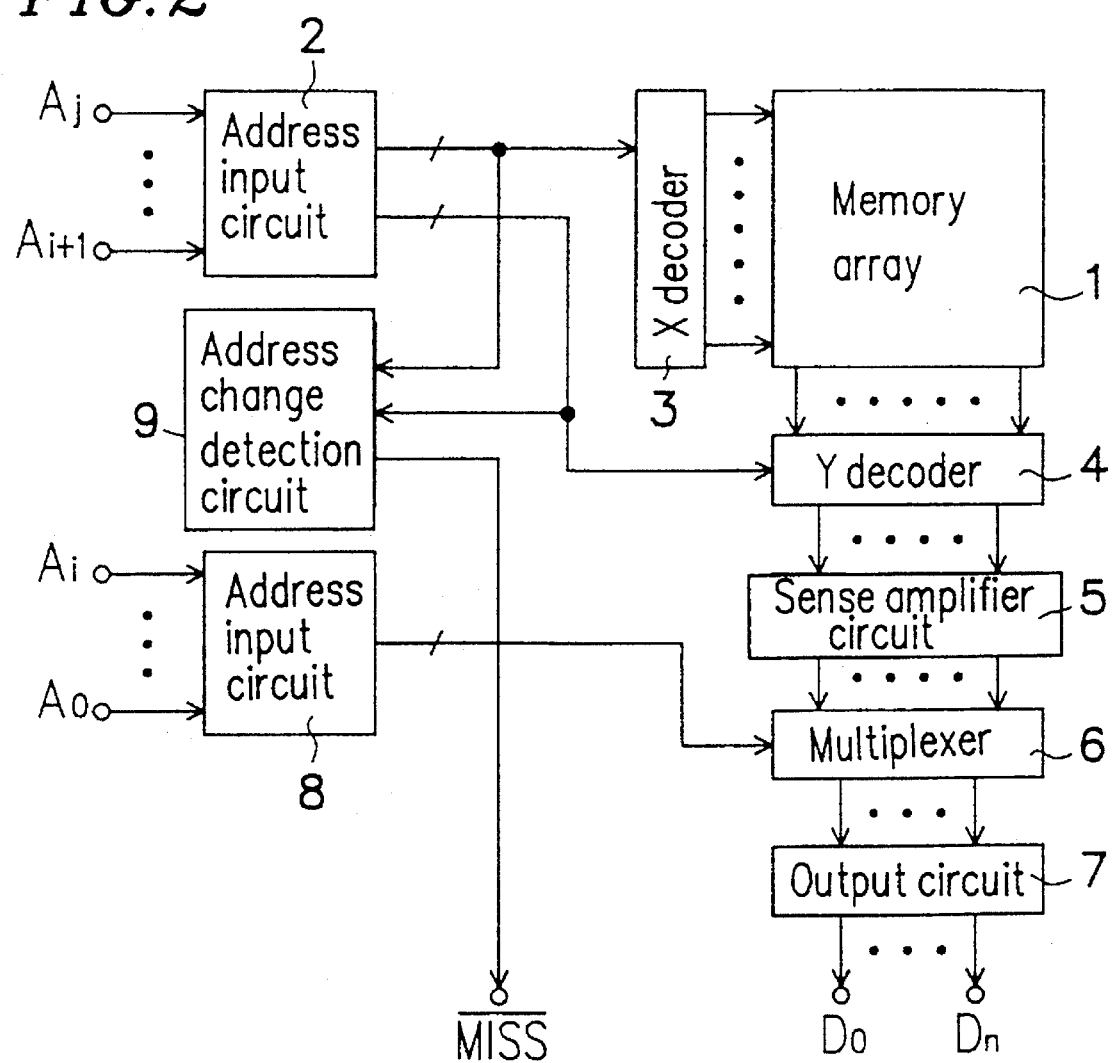
FIG. 2 is a block diagram showing a construction of a semiconductor memory device in one embodiment of the invention.
Figure 3:
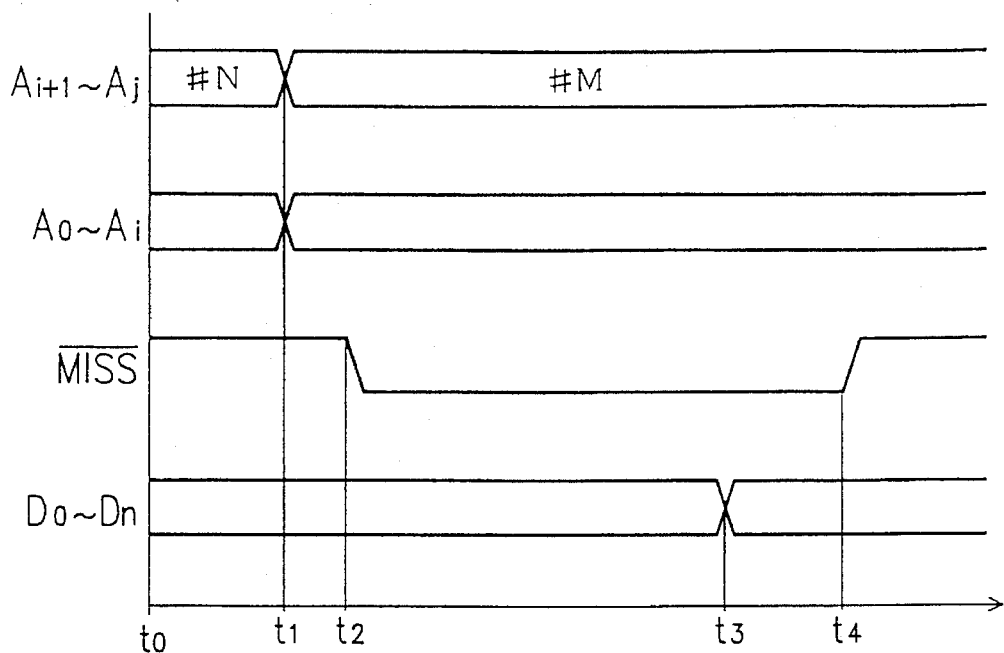
FIG. 3 is a timing diagram illustrating the operation of the semiconductor memory device in a usual access mode in one embodiment of the invention.
Figure 4:
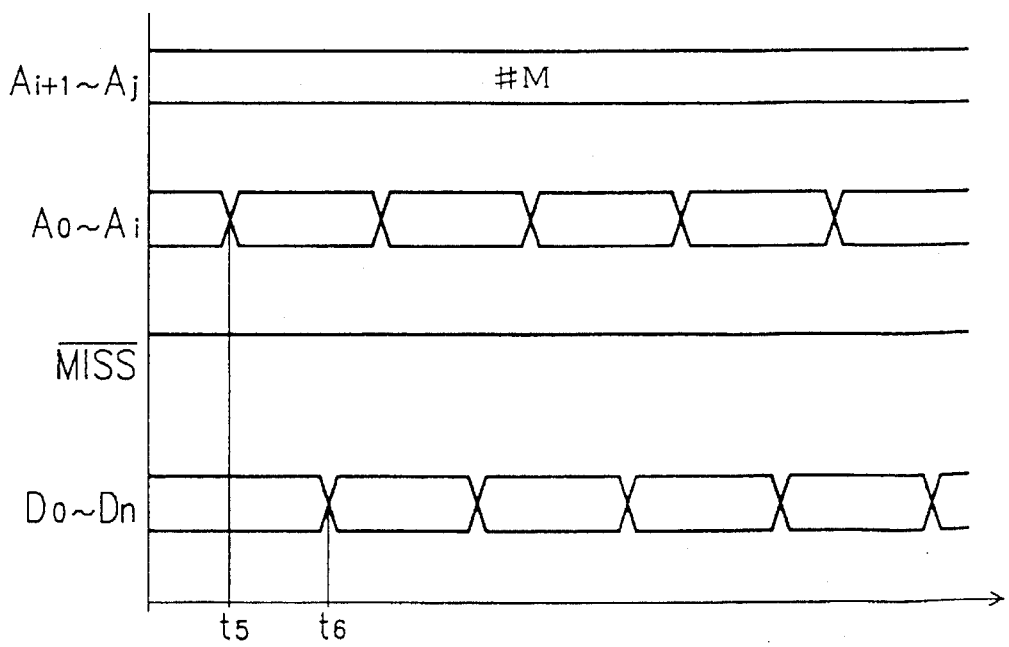
FIG. 4 is a timing diagram illustrating the operation of the semiconductor memory device in a rapid access mode in one embodiment of the invention.
Figure 8:
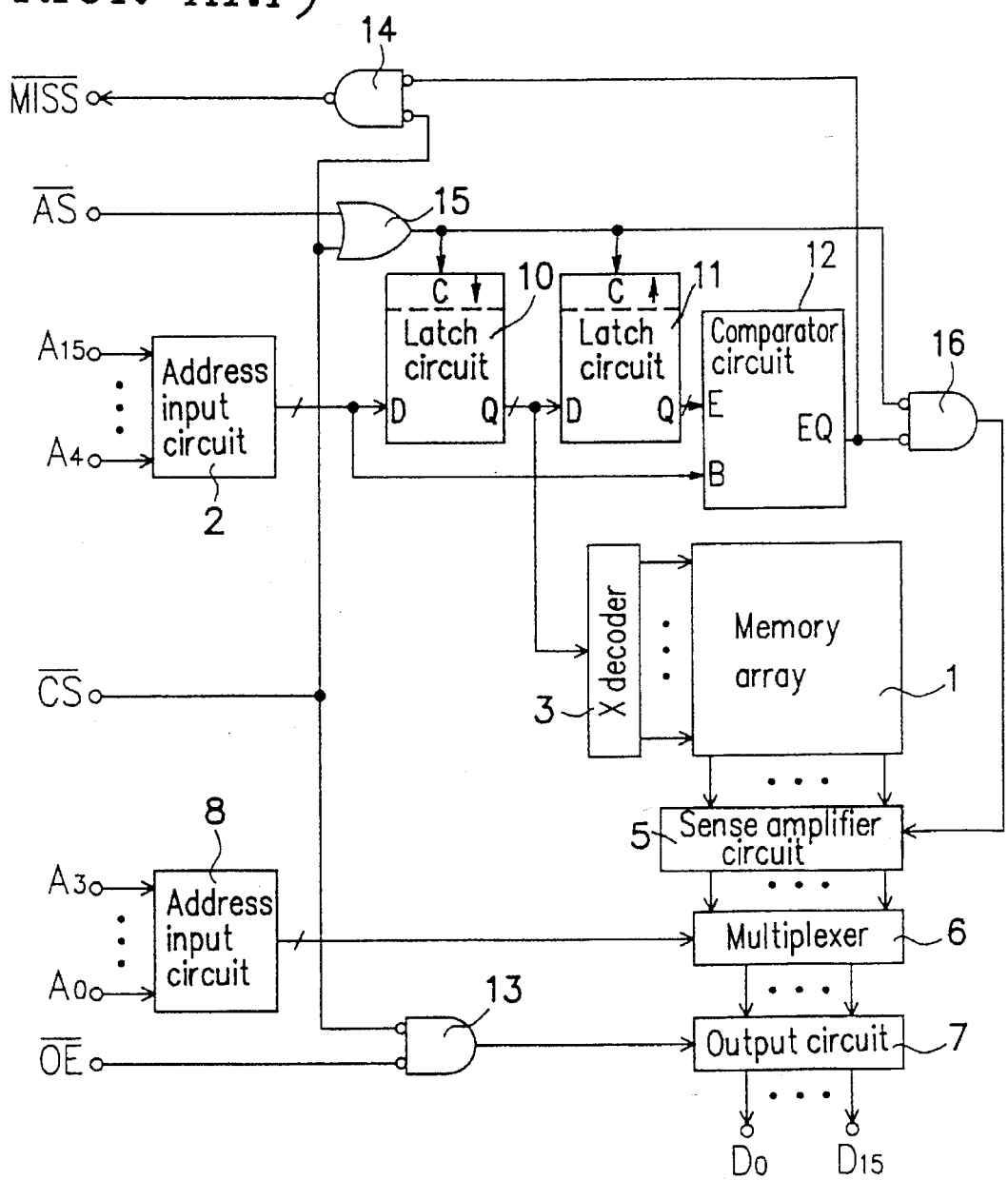
FIG. 8 is a block diagram showing a construction of an EPROM in a prior art.
Figure 9:
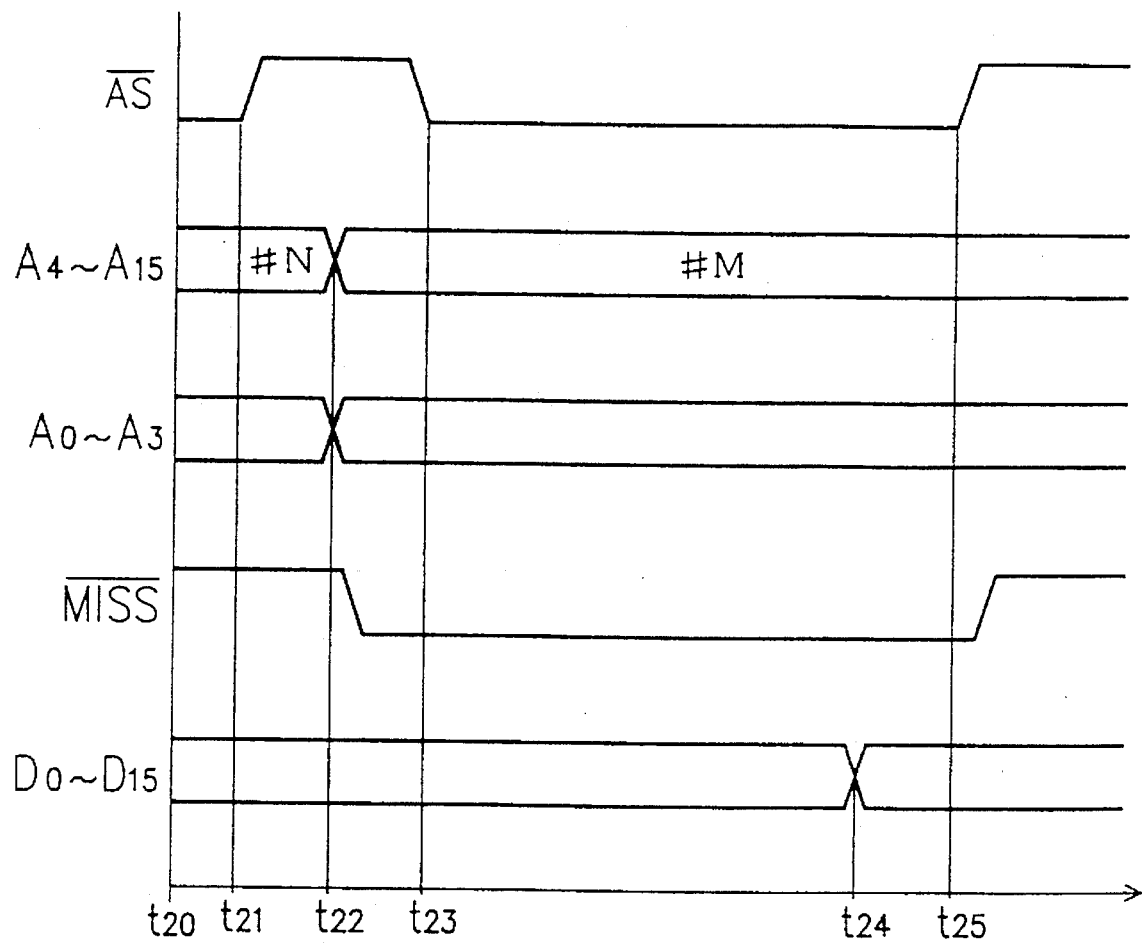
FIG. 9 is a timing diagram illustrating the operation of the EPROM in a usual access mode in the prior art.
Figure 10:
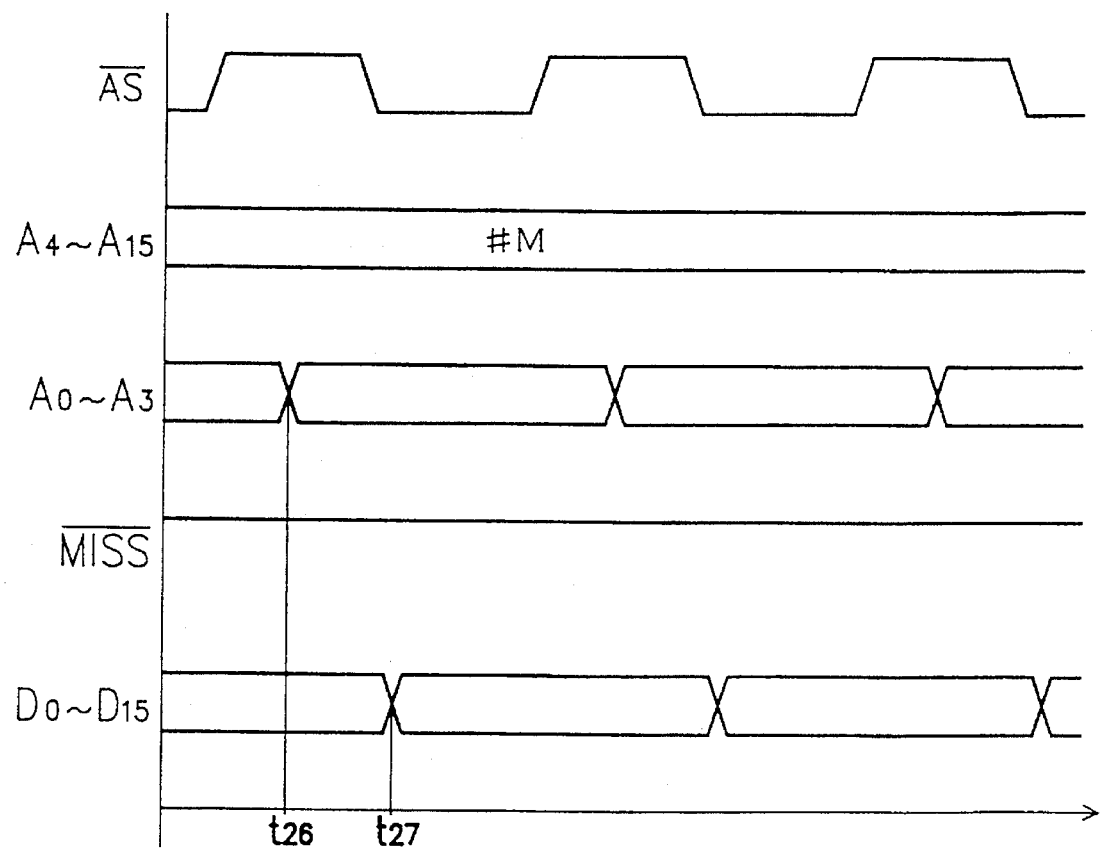
FIG. 10 is a timing diagram illustrating the operation of the EPROM in a rapid access mode in the prior art.

FIGS. 1 to 4 show one embodiment of the invention. FIG. 1 is a block diagram showing a construction of an address change detection circuit, FIG. 2 is a block diagram showing a construction of a semiconductor memory device, FIG. 3 is a timing diagram illustrating the operation of the semiconductor memory device in a usual access mode, and FIG. 4 is a timing diagram illustrating the operation of the semiconductor memory device in a rapid access mode. In these figures, like components having identical functions with those in the prior art example shown in FIG. 8 are indicated by like reference numerals.

Figure 6:
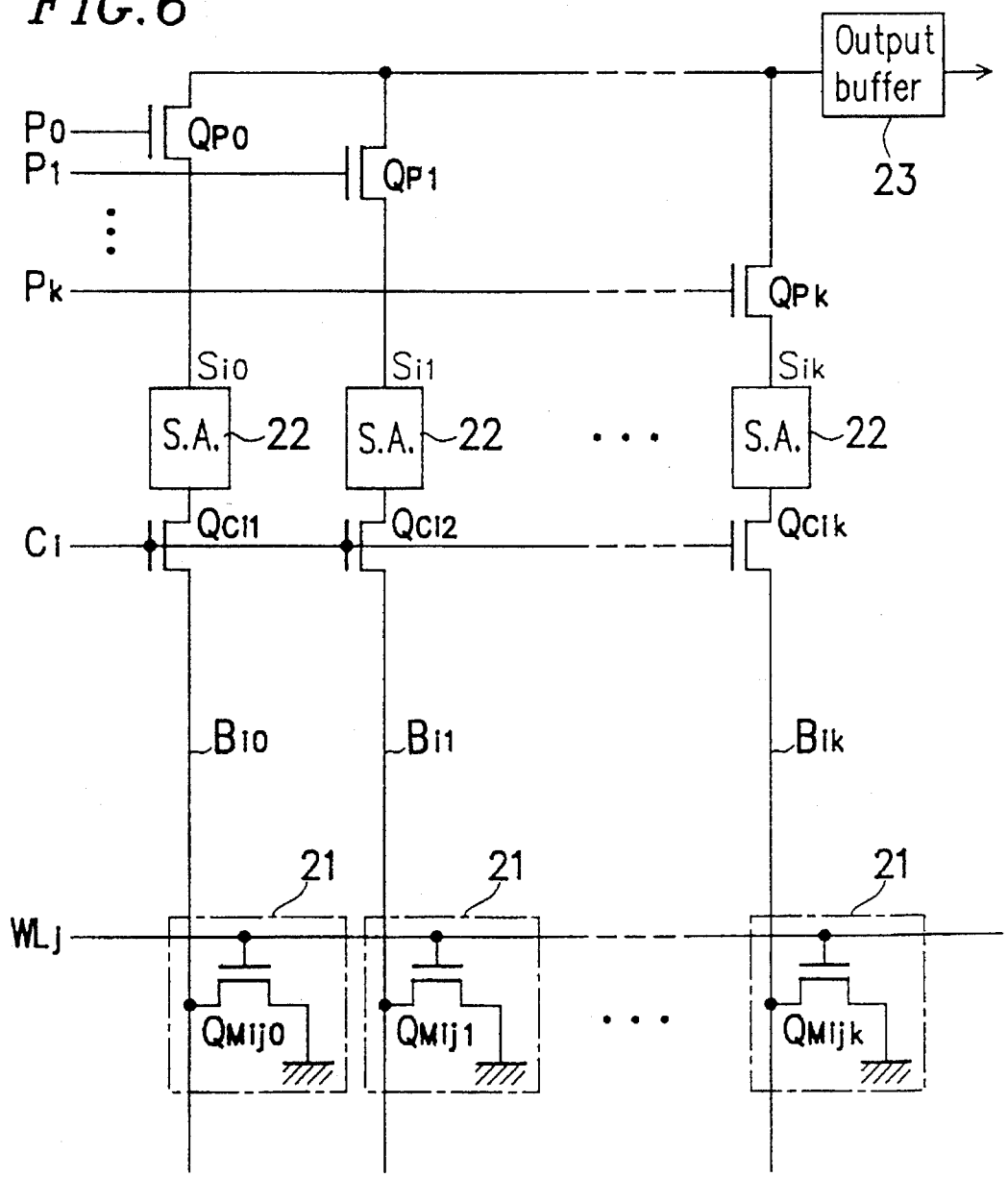
FIG. 6 is a block diagram showing a construction of a ROM with a page mode.
Figure 7:
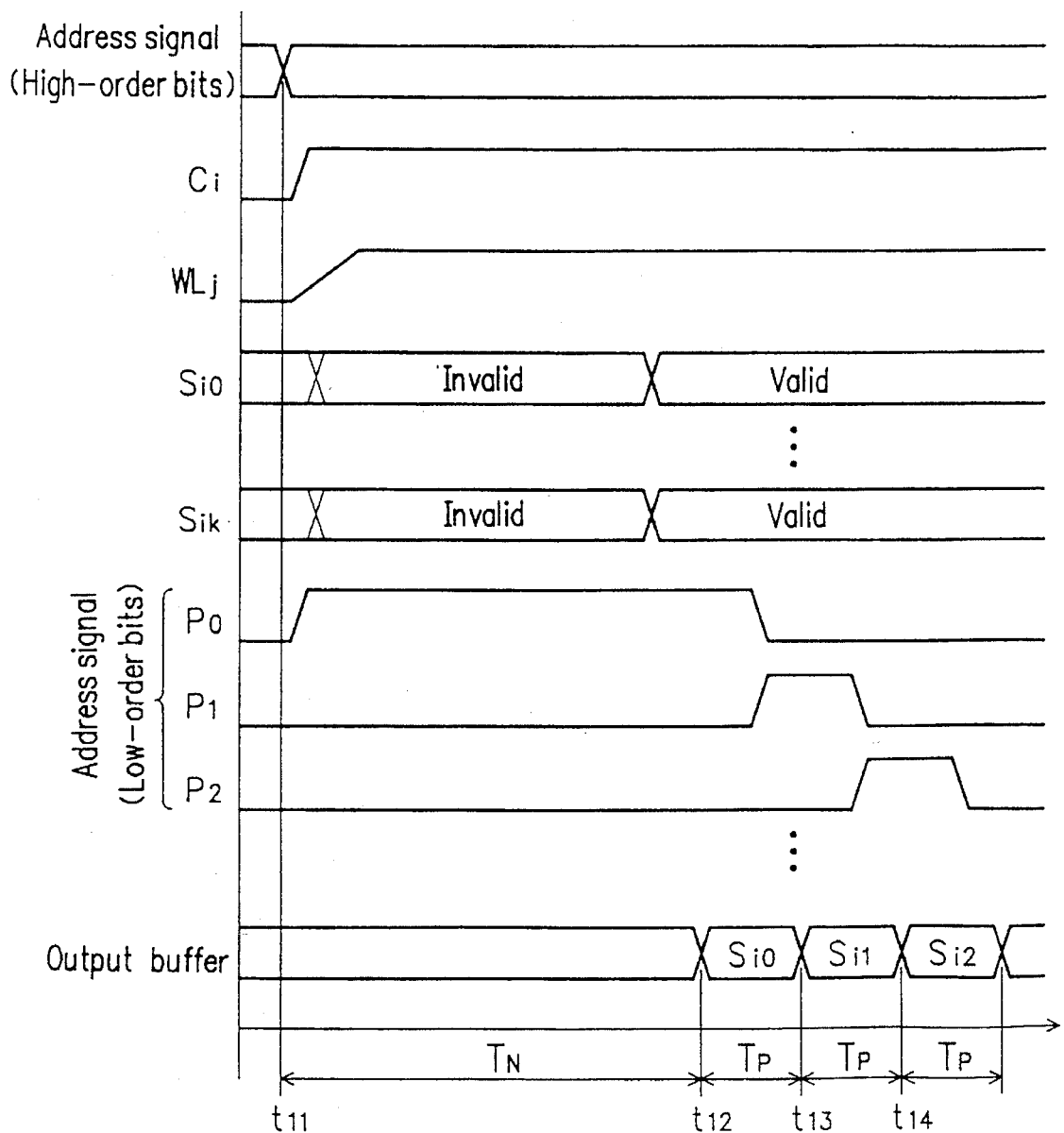
FIG. 7 is a timing diagram illustrating the operation of the ROM shown in FIG. 6.

As is shown in FIG. 2, the semiconductor memory device in this embodiment is provided with a memory array 1 having a number of memory cells. As to the address signal, the high-order bits of the address signal $A_{i+1}$ to $A_j$ are input to a first address input circuit 2, and the low-order bits of the address signal $A_0$–$A_i$ are input to a second address input circuit 8. These address input circuits 2 and 8 are buffers for inputting the address signal fed onto address bus lines. The first address input circuit 2 further divides the input high-order bits of the address signal $a_{i+1}$–$A_j$, and sends the divided bit address signals to an x decoder 3 and a Y decoder 4, respectively. The X decoder 3 decodes the input bit address signals, and selects one of row select lines in the memory array 1. The Y decoder 4 decodes the input bit address signals, and selects one of column select lines in the memory array 1. The row select lines correspond to the row select lines WL shown in FIG. 6. The row select lines are used for selecting a number of memory cells arranged in one and the same row. The column select lines correspond to the column select line $C_i$ shown in FIG. 6. The column select lines are used for selecting some bit lines from among a number of bit lines, and the selected bit lines are output from the Y decoder 4. The output terminals of the Y decoder 4 are connected to a sense amplifier circuit 5.

In this embodiment, the high-order bits of the address signal $A_{i+1}$–$A_j$ are divided and fed to the X decoder 3 and the Y decoder 4. Alternatively, as is shown in FIG. 8, the high-order bits of the address signal $A_{i+1}$–$A_j$ may decoded only in the X decoder 3, and all of the bit lines in the memory array 1 may be connected directly to the sense amplifier circuit 5.

The sense amplifier circuit 5 includes a plurality of sense amplifiers provided for each bit line from the Y decoder 4, and line buffers each coupled with the output terminals of the sense amplifiers. Each sense amplifier amplifies a weak potential of a bit line, so as to make the logical level valid. The outputs of the line buffers of the sense amplifier circuit 5 are connected to input terminals of a multiplexer 6. To the multiplexer 6, the four low-order bits of the address signal $A_0$–$A_i$ are input via the second address input circuit 8. The multiplexer 6 selects (n+1) input lines from among a number of input lines depending on the value of the low-order bits of the address signal $A_0$–$A_i$. The output terminals of the multiplexer 6 are connected to input terminals of an output circuit 7. The output circuit 7 is an (n+1)-bit buffer constituted of a tristate buffer. When an output enable signal which is not shown is made active, the output circuit 7 sends the output signals of the multiplexer 6 onto data bus as data $D_0$–$D_n$. In this figure, the output enable signal and a chip select signal are omitted.

The high-order bits of the address signal $A_{i+1}$–$A_j$ output from the first address input circuit 2 are also fed to an address change detection circuit 9. The address change detection circuit 9 receives the high-order bits of the address signal $A_{i+1}$–$A_j$ and outputs a miss signal $\overline{\text{MISS}}$.

As is shown in FIG. 1, the address change detection circuit 9 is provided with exclusive-OR (EX-OR) circuits 9a the number of which is equal to the number of bits of the address signal $A_{i+1}$–$A_j$. To one input terminal of each EX-OR circuit 9a, a corresponding one of bit signals of the address signal $A_{i+}$–$A_j$ is directly input. To the other input terminal thereof, the corresponding one of the bit signals of the address signal $A_{i+1}$–$A_j$ is input via a first delay circuit 9b. In the first delay circuit 9b, an even number of inverter circuits are connected in series, whereby the respective bit signals of the address signal $A_{i+1}$–$A_j$ can be delayed by a predetermined time. The EX-OR circuit 9a is an exclusive-OR circuit which outputs a high level only when the logical states of both input signals do not match. Therefore, if any of the bit signals of the address signal $A_{i+1}$–$A_j$ are changed, the output of at least one EX-OR circuit 9a is at the high level for the predetermined time in the first delay circuit 9b.

The output of each EX-OR circuit 9a is connected to a gate terminal of one of the corresponding N-channel MOS transistors $Q_{Ai+1}$–$Q_{Aj}$. In these MOS transistors $Q_{Ai+1}$–$Q_{Aj}$, the source terminals are grounded, and the drain terminals are connected to an input terminal of a common second delay circuit 9c. The input terminal of the second delay circuit 9c is connected to a power source via a P-channel MOS transistor $Q_{PU}$ in which the gate terminal is grounded, so as to be pulled up. Accordingly, if the output of any one of the EX-OR circuits 9a becomes a high level, a low-level signal is input to the second delay circuit 9c. In the second delay circuit 9c, an even number of inverter circuits are connected in series, whereby a signal can be delayed.

The output signal of the second delay circuit 9c is fed directly to one input terminal of a NAND circuit 9d, and also fed to the other input terminal of the NAND circuit 9d via a third delay circuit 9e. In the third delay circuit 9e, inverter circuits are connected in series. The number of the inverter circuits is equal to the number of the inverter circuits in the first delay circuit 9b. Thus, it is possible to delay a signal by the predetermined time. When the output of the second delay circuit 9c is at a low level for the predetermined time, the NAND circuit 9d outputs a high-level signal for a time period which is twice as long as the predetermined time. The output signal of the NAND circuit 9d is output as a miss signal $\overline{\text{MISS}}$ via an inverter circuit 9f.

The access operation of the semiconductor memory device having the above construction is described with reference to FIGS. 3 and 4.

At time t0 in FIG. 3, it is assumed that the chip select signal and the output enable signal which are not shown are both in the active state, and the high-order bits of the address signal $A_{i+1}$–$A_j$ having the value of #N are input to the first address input circuit 2 as is shown in the figure. When the value of the address signal $A_{i+1}$–$A_j$ is changed to #M at time t1, the address change detection circuit 9 detects the change of address signal $A_{i+1}$–$A_j$, and sets the miss signal $\overline{\text{MISS}}$ to be a low level (active) at time t2.

In other words, when the value of the address signal $A_{i+1}$–$A_j$ input to the address change detection circuit 9 is changed from #N to #M, a bit signal corresponding to the value #M is immediately input to one input terminal of each EX-OR circuit 9a, but to the other input terminal, the bit signal corresponding to the value #N is continuously input for the predetermined time period via the first delay circuit 9b. Therefore, at least one EX-OR circuit 9a outputs a high-level signal for the predetermined time period after the time t1. During the predetermined time period, any one of MOS transistors $Q_{Ai+1}$–$Q_{Aj}$ is in the ON state, so that the input signal of the second delay circuit 9c is pulled down to the low level.

When the low-level signal for the predetermined time period is delayed in the second delay circuit 9c and output at time t2, the low-level signal is directly fed to one of the input terminals of the NAND circuit 9d, and fed to the other input terminal of the NAND circuit 9d via the third delay circuit 9e in which the low-level signal is delayed by the predetermined time. The NAND circuit 9d outputs the high-level signal when one of the input signals indicates the low level. Accordingly, the NAND circuit 9d outputs the high-level signal for a time period which is twice as long as the predetermined time period after the second delay circuit 9c starts to output the low-level signal. The miss signal $\overline{\text{MISS}}$ output from the inverter circuit 9f is a signal obtained by inverting the output signal of the NAND circuit 9d. Thus, the miss signal $\overline{\text{MISS}}$ is at the low level (active) for a time period from time t2 to t4 which is twice as long as the predetermined time.

The bit signals $A_{i+1}$–$A_j$ of the address i+l 3 signal having the changed value of #M are divided and fed to the X decoder 3 and the Y decoder 4. Then, a number of new data are read out from the memory array 1, and the logical levels thereof are made valid in the sense amplifier circuit 5. The multiplexer 6 selects (n+1) bits of data $D_0$–$D_n$ based on the low-order bits $A_0$–$A_i$ of the address signal which are simultaneously changed with the bit signals $A_{i+1}$–$A_j$. The data $D_0$–$D_n$ are output from the output circuit 7. Herein the total delay time by the first to third delay circuits 9b, 9c, and 9e in the address change detection circuit 9 is set to be longer than a time period from a time when the address signal $A_0$14 $A_j$ is changed to a time when the output circuit 7 outputs the data $D_0$–$D_n$ after the validation of logical levels in the sense amplifier circuit 5. Therefore, the time t3 at which the output circuit 7 outputs the data $D_0$–$D_n$ is slightly prior to the time t4 at which the miss signal $\overline{\text{MISS}}$ is returned to be the high level (inactive).

Accordingly, in the case shown in FIG. 3, the access is performed in a usual access mode in which the sense amplifier circuit 5 makes the logical levels valid. Thus, the microprocessor and the like wait during the time period in which the miss signal $\overline{\text{MISS}}$ is at the low level (active), whereby it is possible to surely read out the data $D_0$–$D_n$ without considering the access mode.

Thereafter, even if only the low-order bits of the address signal $A_0$–$A_i$ are changed at time t5 the value of the address signal of the high-order bits $A_{i+1}$–$A_j$ is not changed from #M. Thus the high level of the miss signal $\overline{\text{MISS}}$ is maintained. However, the multiplexer 6 selects another set of data from the line buffers of the sense amplifier circuit 5 based on the changed address signal $A_0$–$A_i$, the new set of (n+1)-bit data $D_0$–$D_n$ selected by the multiplexer 6 can be output from the output circuit 7, at time t6 after an extremely short time. As is shown, if only the low-order bits of the address signal $A_0$–$A_i$ are sequentially changed, corresponding sets of (n+1)-bit data $D_0$–$D_n$ can be sequentially output at a high speed.

Accordingly, in the case of FIG. 4, the access is performed in a rapid access mode in which the sense amplifier circuit 5 is not required to validate the logical levels. Since the high level (inactive) of the miss signal $\overline{\text{MISS}}$ is maintained, the microprocessor and the like can sequentially read out the output data at a high speed without an unnecessarily long waiting period.

As described above, the semiconductor memory device in this embodiment operates in a usual access mode when the high-order bits of the address signal maintained at a low level (active), until the data $D_0$–$D_n$ output from the output circuit 7 are made valid. When only the low-order bits of the address signal $A_0$–$A_i$ are changed, the miss signal $\overline{\text{MISS}}$ is maintained at a high level (inactive). Accordingly, the microprocessor and the like performs the waiting operation during the low level period of the miss signal $\overline{\text{MISS}}$. When the miss signal $\overline{\text{MISS}}$ is at a high level, the access can be performed without an unnecessarily long waiting period. Thus, a rapid access mode can be automatically utilized without further consideration.

The address change detection circuit 9 detects the change of the address signal $A_{i+1}$–$A_j$ by comparing each of bit signals $A_{i+1}$–$A_j$ of the current address signal with each of bit signals $A_{i+1}$–$A_j$ of the previous address signal which are delayed by the first delay circuit 9b, in the EX-OR circuits 9a. Accordingly, it is unnecessary to store multiple bit signals in the conventional latch circuits, so that the circuit configuration can be simplified. In addition, once the change of the address signal $A_{i+1}-A_j$ is detected, the low level of the miss signal $\overline{MISS}$ is maintained by the third delay circuit 9e, the NAND circuit 9d and the inverter circuit 9f. Thus, it is possible to output a miss signal $\overline{MISS}$ which is the same as that in the prior art example, in a non-synchronous manner without using the address strobe signal. Therefore, a circuit for producing the address strobe signal is not required, so that the circuit configuration can be simplified as compared with the prior art example.

Also in the rapid access mode, the microprocessor can latch data at a higher speed than the prior art example. The principle showing how the data can be latched at a higher speed than the prior art example is described with reference to FIGS. 5A and 5B.

Figure 5A:
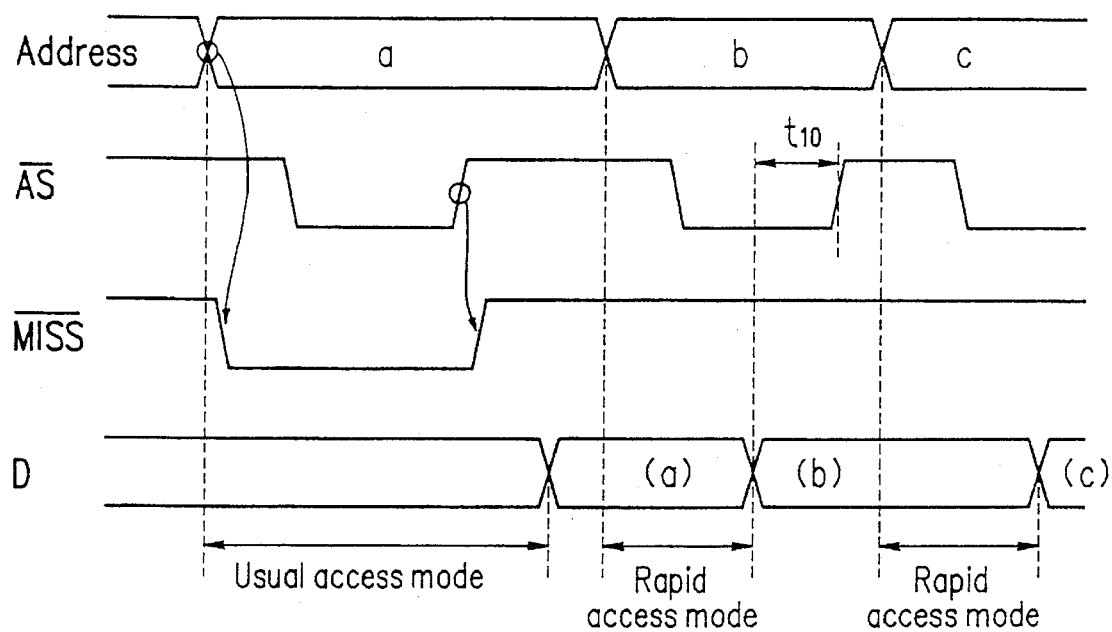
FIGS. 5A and 5B are timing diagrams for illustrating that the data latch in the rapid access mode in one embodiment of the invention is more rapidly performed as compared with a conventional case.

The microprocessor outputs a predetermined address signal A and latches data D which is output from the ROM after a predetermined time. When the data D is to be latched, the microprocessor can further delay the time at which the data D is latched, because there is a difference between a response speed of a CPU and a response speed of a peripheral device. This is performed by monitoring the miss signal $\overline{MISS}$ output from the ROM. Such a delay of data latch time is performed when the ROM operates in the usual access mode. In this mode, the miss signal $\overline{MISS}$ becomes low level (active), and the level of the miss signal $\overline{MISS}$ is monitored by the microprocessor, so that the latch of the data D is delayed. The active period of the miss signal $\overline{MISS}$ is set depending on the usual access speed of the ROM. In the prior art example, the active period of the miss signal $\overline{MISS}$ depends on the address strobe signal $\overline{AS}$. Accordingly, in the prior art example, even when the ROM operates in the rapid access mode, the time period t10 is required due to the address strobe signal $\overline{AS}$, as is shown in FIG. 5A. Thus, it has been difficult to latch the data D by making effective use of the rapid access speed of the ROM.

Figure 5B:
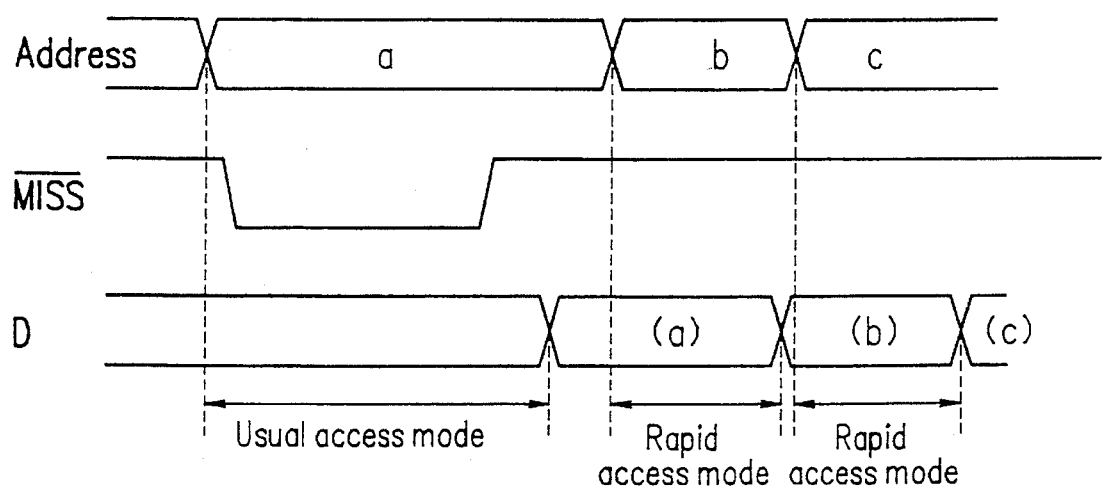

On the other hand, the present invention does not utilize the address strobe signal $\overline{AS}$. Accordingly, it is possible to realize a high-speed data latch by making effective use of the rapid access speed of the ROM without any restriction by the address strobe signal $\overline{AS}$, as is shown in FIG. 5B.

As apparent from the above description, according to the semiconductor memory device of the invention, it is possible to produce a miss signal for conveniently using the rapid access mode, with a simple circuit configuration and in a non-synchronous manner. Therefore, the chip area can be reduced, and the limitations for use can be eliminated.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor memory device capable of operating in a normal access mode and a rapid access mode, the semiconductor memory device comprising:

change detection means, connected to a predetermined number of high-order bits of an address signal, for detecting a change of the address signal;

timer means connected to the change detection means for, when the change detection means detects the change of the address signal, generating a change indicative signal having a specific time width, the change indicative signal indicating occurrence of the change of the address signal; and output means connected to the timer means for outputting a miss signal based on the change indicative signal generated by the timer means, the miss signal controlling a waiting operation of access of an external apparatus in each of the access modes.

2. A semiconductor memory device according to claim 1, wherein the change detection means includes:

a plurality of first delay circuits, each of which receiving one of the predetermined number of the high-order bits of the address signal as an input bit signal and producing a delayed bit signal by delaying the input bit signal by a first predetermined delay time period; and a plurality of comparison means each for comparing the input bit signal with the delayed bit signal.

3. A semiconductor memory device according to claim 1, wherein the rapid access mode is a page mode.

4. A semiconductor memory device according to claim 2, wherein the timer means comprises:

a second delay circuit;

a plurality of n-channel MOS transistors each having a source terminal grounded, a drain terminal connected to an input of the second delay circuit, and a gate terminal connected to each of the comparison means; and a p-channel MOS transistor connected to the input of the second delay circuit and a power source.

5. A semiconductor memory device according to claim 2, wherein the output means comprises:

a third delay circuit for delaying the change indicative signal by a second predetermined delay time period;

a NAND circuit for comparing the change indicative signal as generated by the timer means with the delayed change indicative signal; and an inverter circuit for outputting the miss signal based on an output signal of the NAND circuit.

6. A semiconductor memory device according to claim 5, wherein the third delay circuit includes a plurality of inverters.

7. A semiconductor memory device according to claim 6, wherein the plurality of inverters are an even number of inverters.

8. A semiconductor memory device according to claim 2, wherein the specific time width of the change indicative signal is determined based on the first predetermined delay time period 9. A semiconductor memory device according to claim 1, wherein the miss signal is produced in an asynchronous manner.

10. A semiconductor memory device capable of operating in a normal access mode and a rapid access mode, the semiconductor memory device comprising an address change detection circuit for receiving a predetermined number of high-order bits of an address signal, detecting a change of the address signal and outputting a miss signal indicative of occurrence of the change of the address signal, wherein the address change detection circuit comprises:

a plurality of first delay circuits, each of which receiving one of the predetermined number of the high-order bits of the address signal as an input bit signal and producing a delayed bit signal by delaying the input bit signal by a first predetermined delay time period;

a plurality of comparison circuits, connected to the plurality of first delay circuits, each for comparing the input bit signal with the delayed bit signal and outputting a first signal indicative of a result of the comparison;

a judging circuit, connected to the plurality of comparison circuits, for receiving the respective first signals which are output from each of the comparison circuits and generating a second signal having a specific time width, the second signal indicating occurrence of a difference between the input bit signal and the delayed bit signal in at least one of the predetermined high-order bits of the address signal, thereby indicating occurrence of the change of the address signal; and an output circuit, connected to the judging circuit, for generating the miss signal in accordance with the second signal, the miss signal controlling a waiting operation of access of an external apparatus in each of the access modes.

11. A semiconductor memory device according to claim 10, wherein the rapid access mode is a page mode.

12. A semiconductor memory device according to claim 10, wherein each of the first delay circuits includes a plurality of inverters.

13. A semiconductor memory device according to claim 12, wherein the plurality of inverters are an even number of inverters connected with each other in series.

14. A semiconductor memory device according to claim 10, wherein each of the comparison circuits includes an exclusive-OR circuit.

15. A semiconductor memory device according to claim 10, wherein the judging circuit comprises:

a second delay circuit;

a plurality of n-channel MOS transistors each having a source terminal grounded, a drain terminal connected to an input of the second delay circuit, and a gate terminal connected to each of the comparison circuits; and a p-channel MOS transistor connected to the input of the second delay circuit and a power source.

16. A semiconductor memory device according to claim 10, wherein the output circuit comprises:

a third delay circuit for delaying the second signal by a second predetermined delay time period;

a NAND circuit for comparing the second signal as generated by the judging circuit with the delayed second signal; and an inverter circuit for outputting the miss signal based on an output signal of the NAND circuit.

17. A semiconductor memory device according to claim 16, wherein the third delay circuit includes a plurality of inverters.

18. A semiconductor memory device according to claim 17, wherein the plurality of inverters are a second even number of inverters.

19. A semiconductor memory device according to claim 10, wherein the output circuit comprises:

a third delay circuit for delaying the second signal by a second predetermined delay time period;

a NAND circuit for comparing the second signal as generated by the judging circuit with the delayed second signal; and an inverter circuit for outputting the miss signal based on an output signal of the NAND circuit;

wherein each of the first delay circuits includes a first even number of inverters connected with each other in series, and the third delay circuit includes a second even number of inverters connected with each other in series.

20. A semiconductor memory device according to claim 19, wherein the first even number is equal to the second even number, whereby a time period of the miss signal is twice as long as the first predetermined delay time period.

21. A semiconductor memory device according to claim 10, wherein the specific time width of the second signal is determined based on the first predetermined delay time period.

22. A semiconductor memory device according to claim 10, wherein the miss signal is generated in an asynchronous manner.

* * * * *